United States Patent
Rao et al.

(10) Patent No.: US 11,088,053 B2
(45) Date of Patent: Aug. 10, 2021

(54) ENCAPSULATION STRUCTURE WITH HIGH DENSITY, MULTIPLE SIDED AND EXPOSED LEADS AND METHOD FOR MANUFACTURING THE SAME

(71) Applicant: Guangdong Chippacking Technology Co., Ltd., Dongguan (CN)

(72) Inventors: Xilin Rao, Dongguan (CN); Zhengguo Wen, Dongguan (CN); Jianwei Yang, Dongguan (CN); Yiwei Huang, Dongguan (CN); Yiping Si, Dongguan (CN); Fangbiao Liu, Dongguan (CN)

(73) Assignee: GUANGDONG CHIPPACKING TECHNOLOGY CO., LTD., Dongguan (CN)

( * ) Notice: Subject to any disclaimer, the term of this patent is extended or adjusted under 35 U.S.C. 154(b) by 0 days.

(21) Appl. No.: 17/256,602

(22) PCT Filed: Jan. 9, 2020

(86) PCT No.: PCT/CN2020/071108
§ 371 (c)(1),
(2) Date: Dec. 28, 2020

(87) PCT Pub. No.: WO2021/012641
PCT Pub. Date: Jan. 28, 2021

(65) Prior Publication Data
US 2021/0183749 A1    Jun. 17, 2021

(30) Foreign Application Priority Data
Jul. 19, 2019   (CN) .......................... 201910656493.7

(51) Int. Cl.
*H01L 23/495* (2006.01)
*H01L 23/28* (2006.01)
(Continued)

(52) U.S. Cl.
CPC .... *H01L 23/49548* (2013.01); *H01L 21/4842* (2013.01); *H01L 21/56* (2013.01);
(Continued)

(58) Field of Classification Search
CPC . H01L 21/4842; H01L 21/56; H01L 23/3107; H01L 23/49503; H01L 23/49524
(Continued)

(56) References Cited

U.S. PATENT DOCUMENTS

2008/0191324 A1   8/2008  Qiao et al.
2012/0306031 A1  12/2012  Lo et al.
(Continued)

FOREIGN PATENT DOCUMENTS

CN    101383293 A    3/2009
CN    102810488 A   12/2012
(Continued)

OTHER PUBLICATIONS

Search Report issued in application No. CN 2019106564937. English language translation of search report.

*Primary Examiner* — Caleb E Henry
*Assistant Examiner* — Dilinh P Nguyen
(74) *Attorney, Agent, or Firm* — McClure, Qualey & Rodack, LLP (57) ABSTRACT

The invention discloses an encapsulation structure with high density, multiple sided and exposed leads and method for manufacturing the same. The encapsulation structure includes a package, a die pad and a plurality of leads, wherein the die pad and the leads are disposed at a bottom of the package; bottom surfaces of the leads expose in a bottom surface of the package, and the leads extends towards multiple sides of the package until beyond the package; the package includes an integrated circuit provided on the die pad and connected with the leads, and a plastic
(Continued)

package for packaging the integrated circuit, the die pad and the leads; a bottom surface of the die pad and the bottom surfaces of the leads are provided on the same horizontal plane; the leads comprise a first lead distant from the die pad.

10 Claims, 9 Drawing Sheets

(51) Int. Cl.
*H01L 21/48* (2006.01)
*H01L 21/56* (2006.01)
*H01L 23/31* (2006.01)

(52) U.S. Cl.
CPC .... *H01L 23/3107* (2013.01); *H01L 23/49503* (2013.01); *H01L 23/49524* (2013.01)

(58) Field of Classification Search
USPC .......................................... 254/676, 674, 787
See application file for complete search history.

(56) References Cited

U.S. PATENT DOCUMENTS

| | | | |
|---|---|---|---|
| 2015/0371933 A1* | 12/2015 | Jeon | H01L 23/3114 |
| | | | 257/669 |
| 2016/0293521 A1* | 10/2016 | Chen | H01L 24/32 |
| 2017/0213788 A1* | 7/2017 | Shimanuki | H01L 24/49 |

FOREIGN PATENT DOCUMENTS

| | | |
|---|---|---|
| CN | 103606539 A | 2/2014 |
| CN | 205355046 U | 6/2016 |
| CN | 106611753 A | 5/2017 |
| CN | 109817597 A | 5/2019 |

\* cited by examiner

ENCAPSULATION STRUCTURE WITH HIGH DENSITY, MULTIPLE SIDED AND EXPOSED LEADS AND METHOD FOR MANUFACTURING THE SAME

TECHNICAL FIELD

The present invention relates to the field of chip encapsulation technology, in particular to an encapsulation structure with high density, multiple sided and exposed leads and a method for manufacturing the same.

BACKGROUND ART

Semiconductor integrated circuit is the core of modern technology, the brain of intelligent products, and also the foundation of modern science and technology development; In addition, it is the foundation of modern human civilization, fundamentally changing the way of human life. For example, artificial intelligence, the Internet of things, the Internet, computers, televisions, refrigerators, mobile phones and all kinds of automatic control devices rely on integrated circuits to achieve their intelligent functions. Fabrication of integrated circuits comprises following main processes: design, chip manufacturing, encapsulation and testing, among which the encapsulation process is a key link, and a variety of encapsulation forms based on encapsulation technology are developed to meet special requirements to the performance, volume, reliability, shape and cost of integrated circuits for use in different purposes.

Generally, integrated circuit encapsulation technology includes: 1. technological processes and technology, such as, separating integrated wafers into eligible single chips with grinding and cutting technologies that are able to promise a perfect crystal structure of mono-crystal materials, bonding the chips to the lead frame bond pads with conductive adhesive or eutectic means, connecting the chips to bond wires with micro-connection technology (micron scale) and then protecting the chips and bond wires by macromolecular or ceramic materials; And 2. encapsulation structure research, a product of smaller volume and higher electrical and thermal properties is desired.

Integrated circuit encapsulation is primarily done in two ways: hermetic ceramic encapsulation and plastic encapsulation. By hermetic ceramic encapsulation, chips are packaged by separating with surrounding enclosure via a vacuum packaging device, and typically hermetic ceramic encapsulation is used in high-powered applications. And in plastic encapsulation, epoxy resin is used for chips packaging. Plastic encapsulation technology has developed significantly in its application and efficacy to fully meet the needs of industrial and civilian products, and as material cost is low and production process thereof can be automated, costs are reduced to a great extent, and at present, plastic encapsulation is popular among industrial and civilian products.

Nowadays integrated circuits are encapsulated in many forms. Among them, QFN (Quad Flat No-lead Package) and DFN (Dual Flat No-lead Package) are designed to meet the requirements of high speed, large capacity and low power consumption, and are developed for portable terminal products. They are characterized with more powerful chips packaged in the same volume, low power and heat consumption, good frequency characteristics, and reduced material usage, however, encapsulation process thereof is complex, for example, the lead frame is to be manufactured by etching, which makes it difficult to control quality, causes environmental pollution, is of low efficiency and high cost; what's more, a wafer rear side needs coating, which renders bonding efficiency drop by more than 30%, and capillary wearing speed 2 times quicker; and wafer dicing is done by cutting, which is not efficient enough, while a dicer equipment is expensive, and it is not easy to control quality, and process control is difficult and unsatisfactorily efficient when the equipment is operated by an enterprise. However, due to functional and dimensional requirements of modern products, especially computers, mobile phones, IPADs, and other portable devices, the above mentioned two forms are the encapsulation structures that are applied by an absolute majority of current mid-to-high-end encapsulation products.

IC encapsulation means has a significant impact on performance (electrical and thermal properties), reliability, and cost of IC products. With the development of chip manufacturing technology from micron to nanometer scale, Moore's law that chip function of unit area doubles every 18 months is gradually failing. In the future, powerful cloud computing, Internet of Things and mobile network, etc. rest on breakthrough of its core technology, integrated circuits. Improvement of integrated circuits in terms of large capacity, high speed and low power consumption will become more and more difficult in chip manufacturing, and to a greater extent breakthrough of encapsulation form and technology will count. In order to meet this end, high-end encapsulation structures such as DFN, QFN and BGA (Ball Grid Array) are commonly used now. Nevertheless, all of them involve a complex manufacturing process and a great impact on environment, requires a high equipment investment, is difficult to control quality and costly.

In short, a great emphasis is put on internal resistance and heat dissipation as chip size is substantially reduced, and with conventional chip encapsulation means, the smaller a chip is, the bigger the internal resistance is, and the worse heat dissipation is; as a harsh demand has been laid on integrated circuit products by mobile Internet products, it is necessary to have an optimum performance of all of size, internal resistance and heat dissipation.

SUMMARY OF THE INVENTION

The present invention discloses an encapsulation structure with high density, multiple sided and exposed leads and production method thereof, aiming to reduce thickness and volume of the encapsulation structure, reduce internal and thermal resistance of the package, and/or improve the plastic encapsulation stability of the leads/die pad(s), and/or the quality of bonding/welding, and improve performance and reliability of products.

An encapsulation structure with high density, multiple sided and exposed leads comprises:

a package body, a die pad and a plurality of leads, wherein the die pad and the leads are disposed at a bottom of the package body; bottom surfaces of the leads expose in bottom surface of the package body, and the leads extends towards multiple sides of the package body until beyond the package body; the package body includes an integrated circuit provided on the die pad and connected with the leads, and a plastic package body for packaging the integrated circuit, the die pad and the leads; a bottom surface of the die pad and the bottom surfaces of the leads are provided on the same horizontal plane.

Preferably, the leads include a first lead which stays distant from the die pad.

Preferably, the die pad is exposed in the bottom surface of the package body, and the bottom surface of the die pad and the bottom surface of the plastic package body are in the same horizontal plane.

Preferably, the package body has four sides, and the plurality of leads extend along two opposite sides or four side surfaces of the package body and extend beyond the package body.

Preferably, the first lead comprises a straight portion extending along a horizontal plane, and one end of the straight portion extends beyond the package body.

Preferably, the first lead also comprises a turning portion extending on a horizontal plane, the turning portion is connected to another end of the straight portion located within the package body, and the turning portion is located in the package body, the turning portion comprises an inclined section and a parallel section, and the parallel section is parallel to and connected with the straight portion by the inclined section; the turning portion and the straight portion satisfy the following relation: $L1=L2 \times \cos\theta+L3$, in which L1 is length of the straight portion, L2 is length of the inclined section, L3 is length of the parallel section and $\theta$ is an angle between the inclined section and the straight portion.

Preferably, an end of the first lead located inside the package body is provided with a first end surface facing the package body, the package body is provided with a second end surface facing the first end surface, the first end surface is provided with a first indentation, and/or the second end surface is provided a second indentation.

Preferably, an upper surface of one end of the first lead located in the package body is provided with a third indentation, and/or an upper surface of the die pad on a side close to the first lead is provided with a fourth indentation.

Preferably, a T-shaped boss is provided on an upper surface of one end of the first lead located in the package body, and the T-shaped boss comprises a boss supporting platform connected to the upper surface of the first lead and a boss welding platform on top of the boss supporting platform, and width of the boss welding platform is greater than width of boss supporting platform.

Preferably, the width of the T-shaped boss A and the width of boss supporting platform, C satisfy following relation:

$$\tfrac{1}{2}(A+C)<A<\sqrt{2}/2(A+C)$$

A method for manufacturing the mentioned encapsulation structure with high density, multiple sided and exposed leads comprising following steps:

punching a metal lead frame to be a die pad and a plurality of leads, the leads comprises a first lead distant from the die pad;

connecting an integrated circuit with the die pad and the leads;

packaging the integrated circuit, the die pad and the leads with plastic to be an encapsulation package, wherein, the die pad and the leads are provided in a bottom of the package body, bottom surfaces of the leads exposed in a bottom surface of the package body, and the leads extends towards multiple sides of the package body until beyond the package body: a bottom surface of the die pad and the bottom surfaces of the leads are provided on the same horizontal plane; and punching and separating the encapsulation package.

Beneficial effects of the present invention include but are not limited to: in the encapsulation package of the present invention, the die pad and the leads are provided in a bottom of the package body, the leads are exposed in the bottom surface of the package body and extends towards multiple sides of the package body until beyond the package body and the die pad is exposed in the bottom surface of the package body; consequently, thickness and volume of the entire encapsulation package is further reduced, internal resistance and heat resistance is further reduced with improved heat dissipation properties and product frequency; what's more, density of the leads are increased, to have a wide application range; with the leads of planar parts, strength and stability when subject to welding stress is greater to promise a more reliable product performance; in addition, with reduced encapsulation package volume and materials, product cost is to a great extent reduced; still further, as the encapsulation structure is of good coplanarity, and the encapsulation structure can be fabricated by punching and cutting, which relieves machining complexity and difficulty; finally, plastic packaging stability of the leads and the die pad and bonding/welding quality is improved too.

BRIEF DESCRIPTION OF DRAWINGS

In order to explain technical schemes of embodiments of the present invention more clearly, a brief description will be given to drawings which are to be used in description of the embodiments and prior arts. Obviously, the drawings in the following description are only some embodiments of the present invention. For those of ordinary skill in the art, other drawings can be obtained based on these drawings without creative work.

FIG. 1-1 is a schematic structural view of an encapsulation structure with high density, multiple sided and exposed leads provided by an embodiment of the present invention.

FIG. 1-2 is a section view of an encapsulation structure with high density, multiple sided and exposed leads provided by an embodiment of the present invention.

FIG. 2-1 is a schematic structural view of an encapsulation structure with high density, multiple sided and exposed leads provided by a second embodiment of the present invention.

FIG. 2-2 is a bottom view of an encapsulation structure with high density, multiple sided and exposed leads provided by a second embodiment of the present invention.

FIG. 2-3 is a schematic structural view of the leads of an encapsulation structure with high density, multiple sided and exposed leads provided by a second embodiment of the present invention.

FIG. 4-1 is a schematic view of a lock slot in an embodiment of the present invention.

FIG. 4-2 is a schematic view of a second lock slot in an embodiment of the present invention.

FIG. 4-3 is a schematic view of a third lock slot in an embodiment of the present invention.

FIG. 4-4 is a schematic view of an encapsulation structure including a boss according to an embodiment of the present invention;

FIG. 4-5 is a detailed structural view of a package structure including a boss according to an embodiment of the present invention;

FIG. 4-6 is a schematic view of structural dimensions of the boss in an embodiment of the present invention;

FIG. 5-1 is a schematic view of an encapsulation structure including a die pad according to an embodiment of the present invention;

FIG. 5-2 is a schematic view of an encapsulation structure including two die pads according to an embodiment of the present invention;

FIG. 5-3 is a schematic view of an encapsulation structure including three die pads according to an embodiment of the present invention;

FIG. 7-1 is a schematic diagram of a die pad exposed encapsulation structure according to an embodiment of the present invention;

FIG. 7-2 is a schematic diagram of a die pad unexposed encapsulation structure according to an embodiment of the present invention;

FIG. 8-1 is a schematic diagram of an encapsulation structure with symmetrical leads exposed on four sides of an embodiment of the present invention;

FIG. 8-2 is a schematic diagram of an encapsulation structure with symmetrical leads exposed on two sides of an embodiment of the present invention;

FIG. 8-3 is a schematic diagram of an encapsulation structure with unsymmetrical leads exposed on four sides of an embodiment of the present invention;

FIG. 9-1 is a schematic diagram of an encapsulation structure with T-shaped leads exposed on four sides of an embodiment of the present invention;

FIG. 9-2 is a schematic diagram of an encapsulation structure with upwardly convex leads of an embodiment of the present invention;

EMBODIMENTS

In order to enable those skilled in the art to better understand the schemes of the present invention, the technical schemes of the embodiments of the present invention will be described dearly and completely with reference to the accompanying drawings of the embodiments of the present invention. Obviously, the described embodiments are only a part of the embodiments of the present invention, rather than all the embodiments. Based on the embodiments of the present invention, all other embodiments obtained by those of ordinary skill in the art without creative work shall fall within the protection scope of the present invention.

In the description of the present invention, it should be understood that the directions or positions indicated by terms like "center", "longitudinal", "transverse", "length", "width", "thickness", "upper", "lower", "front", "back", "left", "right", "vertical", "horizontal", "top" "bottom", "inner" "outer", "clockwise", "counterclockwise" are based on the orientation or positional relationship shown in the drawings, which is only for the convenience of describing the present invention and simplifying the description, rather than indicating or implying that the device or element referred to must have a specific orientation, be constructed and operated in a specific orientation, which therefore cannot be understood as a limitation to the present invention.

In addition, the terms like "first", "second", "third" are used to distinguish different objects, rather than describing a specific order. In addition, the terms "including" and "having" and any variations thereof are intended to cover non-exclusive inclusion. For example, a process, method, system, product, or device that includes a series of steps or units is not limited to the listed steps or units, but optionally includes unlisted steps or units, or optionally also includes other steps or units inherent in these processes, methods, products or equipment.

The following are detailed explanations through specific embodiments.

Figure 11:
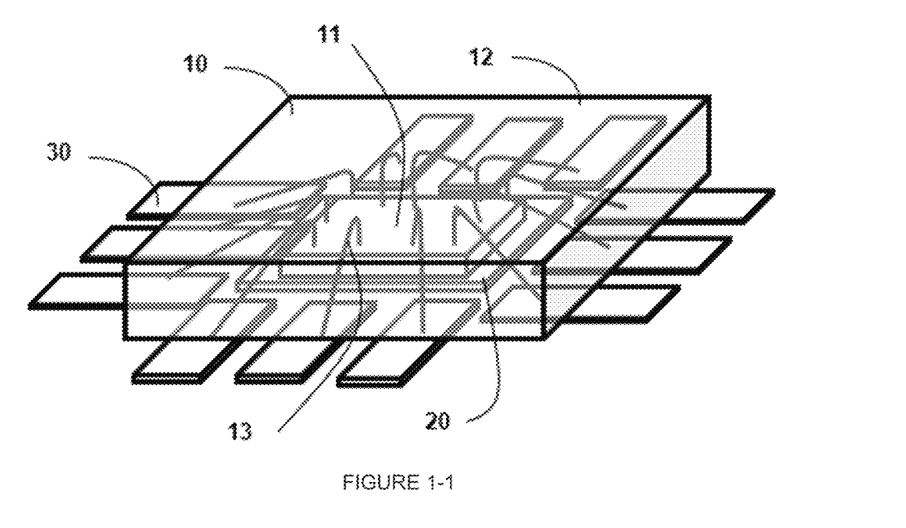
Figure 12:
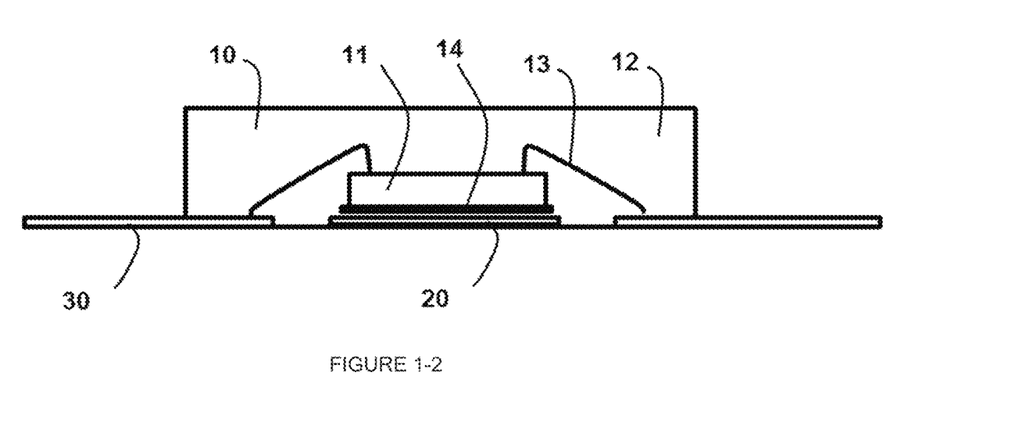
Figure 21:
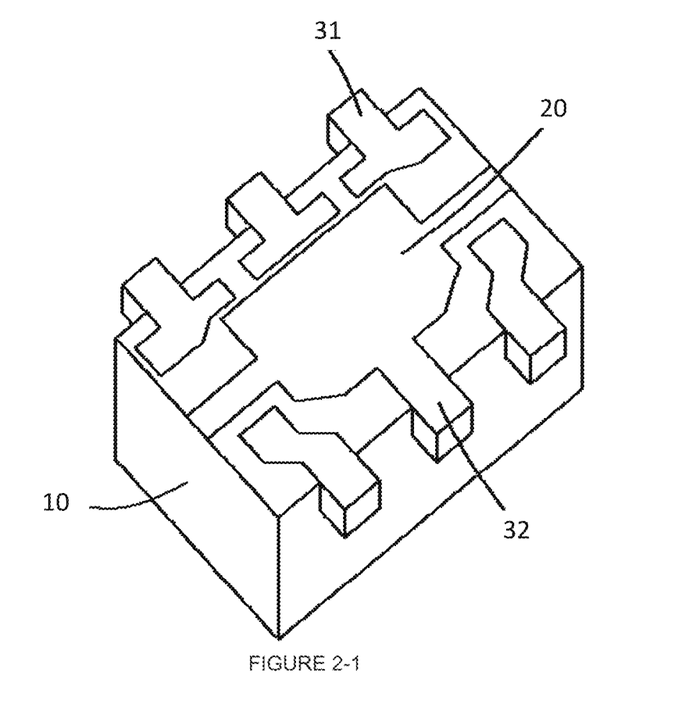

With reference to FIGS. 1-1 to 1-2 and FIGS. 2-1 to 2-1, the present invention provided an encapsulation structure with high density, multiple sided and exposed leads, comprising a package body 10 and a lead frame, wherein the lead frame comprises a die pad 20 and leads 30, the package body 10 comprises an integrated circuit 11 and a plastic package 12, the package body 10 further includes a metallic wire 13 and a solder material 14.

The die pad 20 and the leads 30 are provided on a bottom of the package body 10, a bottom surface of each of the leads 30 is exposed in the bottom of the package body 10, and the leads 30 extend towards multiple sides of the package body 10 until beyond the package body 10; the integrate circuit 11 is provided on the die pad 20 and connected with the leads 30, the plastic package 12 is configured for packaging the integrated circuit 11, the die pad 20 and the leads 30. The metallic wire 13 is configured to connect the integrated circuit 11 and the leads 30, and the solder material 14 is configured to connect the integrated circuit 11 and the die pad 20.

Further, the leads 30 can be a planar member, which extends only on a horizontal plane; and in some embodiments, the leads can be a non-planar member. It is possible that all of the bottom surfaces of the leads 30 are exposed in the bottom of the package body 10; it is also the case when the bottom surfaces of the leads 30 are partially exposed in the bottom of the package body 10.

Further still, the die pad 20 can be exposed in the bottom of the package body 10, or the die pad 20 doesn't protrude out but reside inside the package body 10.

Still further, the bottom surface of the plastic package 12, and for the bottom surface of the die pad 20, and/or the bottom surfaces of the leads 30 are in the same horizontal plane.

Further, the package body 10 is square or rectangular, with four sides. The plurality of leads 30 extend towards two opposing sides or all four sides of the package body 10, and extend out of the package body 10; leads in two opposing directions can be symmetrical and asymmetrical. Optionally, to increase quantity of the leads, and improve package density, preferably, leads extend in all four sides of the package body, that is, leads 30 extends in all four sides of the package body 10.

Further, the die pad 20 and leads 30 is made of metallic materials, especially copper alloy; and the plastic package body 12 could be made of plastic materials.

Figure 22:
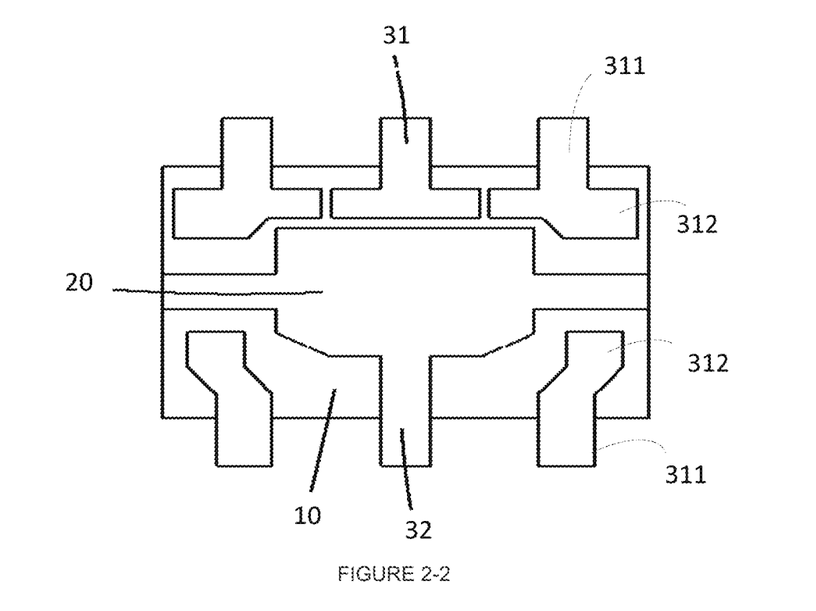

As shown in FIG. 2-1 and FIG. 2-2, in an embodiment of the present invention, the leads comprises a first lead 31 distant from the die pad 20, the first lead 31 comprises a straight portion 311 extending on a horizontal plane, one end of the straight portion 311 reaches out of the package body 10, and a bottom of the straight portion 311 is exposed in the bottom of the package body 10. Preferentially, the leads 30 comprise a second lead 32 connected to the die pad 20.

As shown in FIG. 2-2, in an embodiment of the present invention, the first lead further comprises a turning portion 312 extending on a horizontal plane, the turning portion 312 is connected to an end of the straight portion 311 located in the package body 10, and the turning portion 312 is located in the package body 10. The turning portion 312 is designed to enhance connection strength between the first lead 30 and the plastic package body 12. Optionally, the turning portion 312 is a component perpendicular to the straight portion 311. Optionally, the turning portion 312 includes an inclined section connected to the straight portion 311 and a parallel section connected to the inclined section. And optionally, the turning portion 312 is in any other different shapes.

Figure 23:
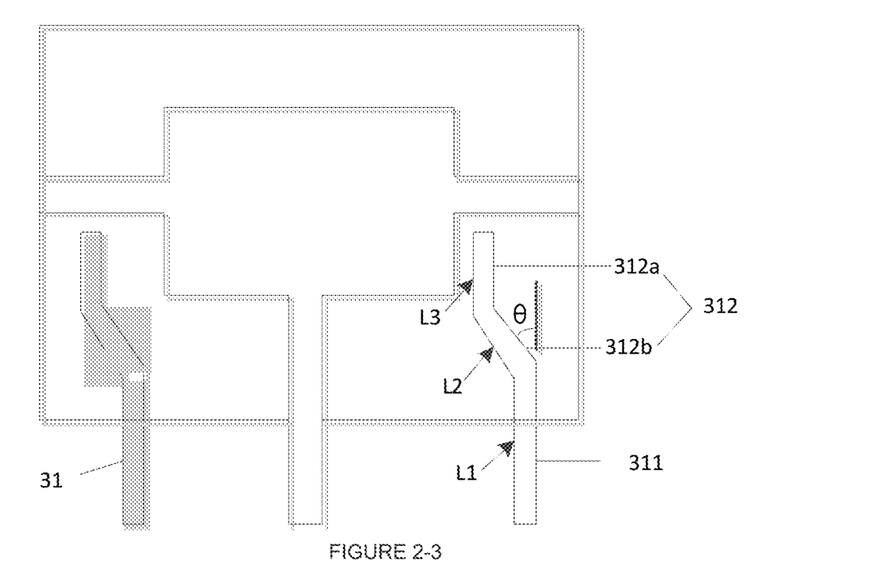

As shown in FIG. 2-3, in an embodiment of the present invention, the turning portion comprises an inclined section 312b and a parallel section 312a, and the parallel section 312a is parallel to the straight portion 311 and connected to the straight portion 311 by the inclined section 312b; the turning portion 312 and the straight portion 311 satisfy the following relation: L1=L2×cos θ+L3, where L1 is length of the straight portion 311, L2 is length of the inclined section 312b, L3 is length of the parallel section and θ is an angle between the inclined section 312b and the straight portion 311.

Further, the following relation is satisfied: L3=L2

Further still, a ratio of a length of the straight portion 311 inside the package body 10 to a length of the straight portion 311 outside the package body 10 is from 2:3 to preferably 1:2.

As described above, by adopting the above described turning portion 312, the first lead 31 is eligible for an optimum stress relationship and not liable to deformation; in addition, a perfect adherence is achieved after joining the package body 10. Among that, the parallel section 312a can be used to connect the metallic wire 13 so as to realize a connection with the integrated circuit 11, and the above limitation renders the parallel section 312a a suitable dimension in terms of welding area and heat transfer property, and remains stable after receiving welding stress, which is contributive to improve welding quality.

As shown in FIG. 1-2, in some embodiments of the present invention, the integrated circuit 11 is fixed to a front side of the die pad 20 by die attaching or reflow welding process, and connected to the leads by the metallic wire 13. And the solder material 14 is, for example, a solder paste provided in the reflow welding process.

Figure 3:
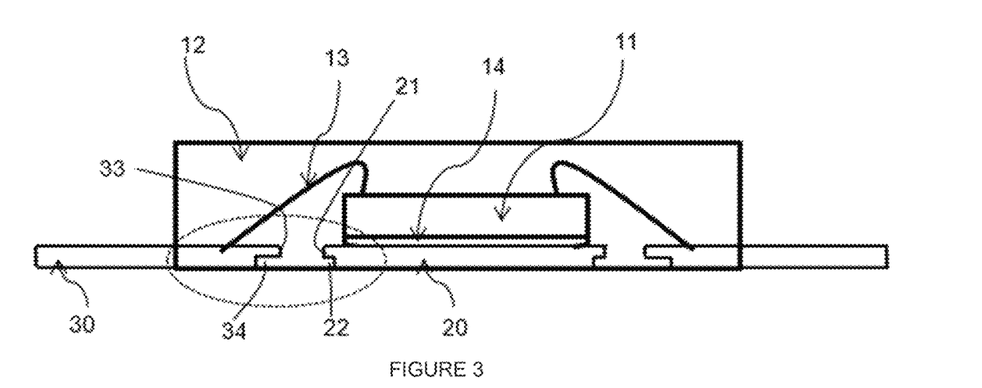
FIG. 3 is a section view of an encapsulation structure with high density, multiple sided and exposed leads provided by a third embodiment of the present invention.

As shown in FIG. 3, in some embodiments of the present invention, the end of the first lead 31 located inside the package body 10 is provided with a first end surface 33 facing the die pad 20, the die pad 20 is provided with a second end surface 21 facing the first end surface 33, the first end surface 33 is provided with a first indentation 34, and/or the second end surface 21 is provided a second indentation 22.

Figure 41:
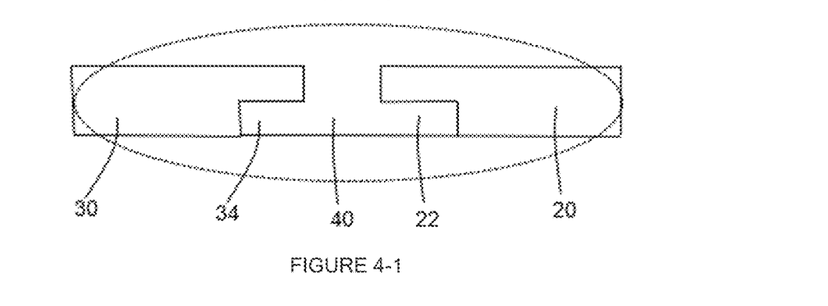

As shown in FIG. 4-1, the first indentation 34 and the second indentation 22 are arranged on a side close to the bottom of the package body 10, so that a T-shaped locking slot 40 is formed between the first end face 33 and the second end face 21. The T-shaped locking slot 40 helps to keep the die pad 20 and the leads 30 firmly fixed in the plastic package body 12.

Figure 42:
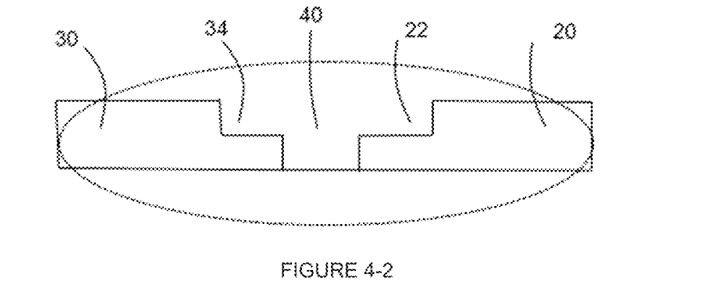

As shown in FIG. 4-2, the first indentation 34 and the second indentation 22 are arranged on a side away from the bottom of the package body 10, so that an inverted T-shaped lock slot 40 is formed between the first end face 33 and the second end face 21.

Figure 43:
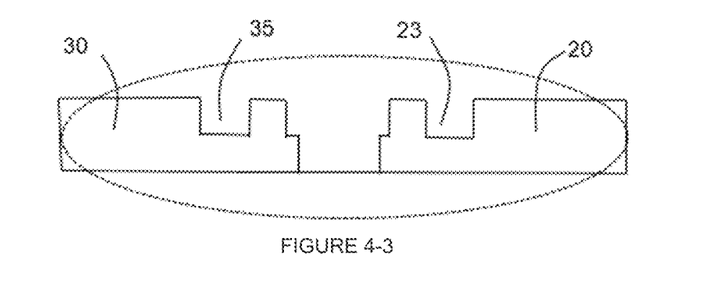

As shown in FIG. 4-3, in an embodiment of the present invention, a third indentation 35 is provided in an upper surface of one end of the first lead 31 located in the package body 10, and/or a fourth indentation 23 is provided in an upper surface of the die pad 20 on a side close to the first lead 31. By providing the third indentation 35 and/or the fourth indentation 23, a recessed package locking slot is formed to further fix the die pad 20 and the leads in the plastic package body 12.

Figure 44:
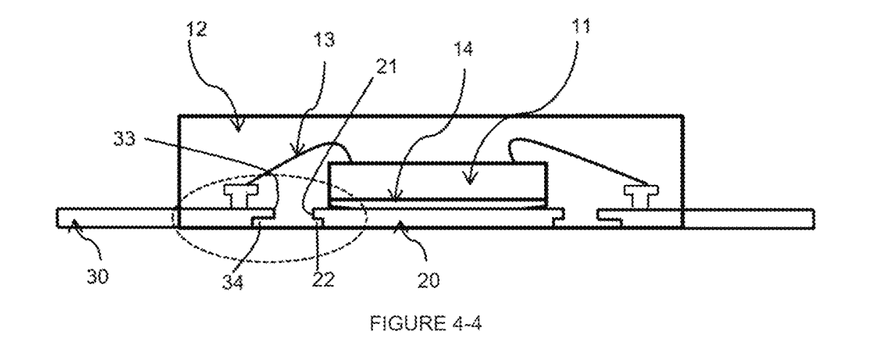

As shown in FIG. 4-4, in an embodiment of the present invention, a boss 36 is provided on the upper surface of one end of the first lead 31 located in the package body 10. Specifically, the first lead 31 comprises a straight portion 311, and a boss 36 is provided on the upper surface of an end of the straight portion 311 in the package body 10; or the first lead 31 comprises a turning portion 312 connected to the straight portion 311 and the upper surface of an end of the turning portion 312 near the integrated circuit is provided with a boss 36. On one hand, the boss 36 is configured to weld the metallic wire 13 and realize a connection with the IC 11; on the other hand, the boss itself is inserted into the package body 10 as a projecting part to achieve a good connection with the plastic package body 12, and to have the first lead 31 secured in the package body 10.

Figure 45:
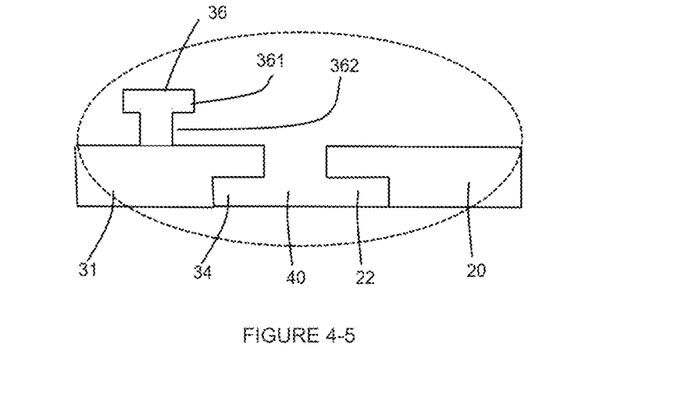

As shown in FIG. 4-5, the boss 36 could be a T-shaped boss, comprising a boss supporting platform 362 and a boss welding platform 361, the boss supporting platform 362 is connected to the upper surface of the first lead 31, and the boss welding platform 361 is arranged on the top of the boss supporting platform 362, and width of the boss welding platform 361 is greater than that of the boss supporting platform 362. The upper surface of the boss welding platform 361 is a solder side for welding the metallic wire 13. Optionally, the boss welding platform 361 is a column such as a cylinder, the boss supporting platform 362 is also a column such as a cylinder, and both of them are coaxial cylinders, and diameter of the boss welding platform 361 is larger than that of the boss supporting platform 362. Therefore, the T-shaped boss has a larger upper part and a smaller lower part, which can be firmly fixed in the plastic package body 12.

Figure 46:
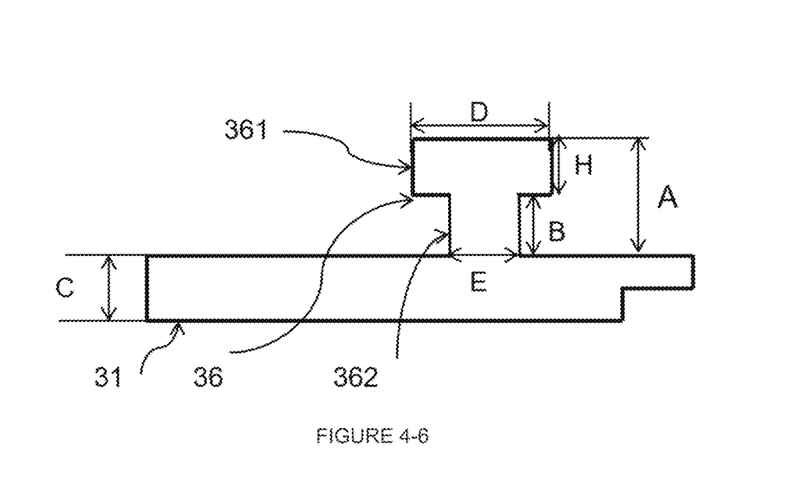

As shown in FIG. 4-FIG. 6, the above described T-shaped boss design has the following features:

1. It is assumed that thickness of both the leads and the die pad is C. Height of the T-shaped boss is A comprising a height B of the boss supporting platform 362 and a height H of the boss welding platform 361, diameter of the boss supporting platform 362 is E and diameter of the boss welding platform 361 is D. There are some requirements on height of the T-shaped boss, as in case the boss is too high welding force at the second bond of the metallic wire will be unstable, which will in turn affect the welding quality; and in case the boss is too low, advantages of the boss design will not be apparent, and it is also very difficult to machine and manufacture such a boss. By theoretical calculation and experimental verification, when height of the boss is in a certain ratio with the height of the leads, the boss has good stability (welding stress stability of the boss), and advantages of the boss structure are obvious.

Optionally, the height A of the T-shaped boss and the height C of the leads (the die pad) meet the following formula:

$$½(A+C)<A<\sqrt{2}/2(A+C)$$

Preferentially, $A=(A+C)\times(\sqrt{5}-1)/2$ i.e. $A=0.618*(A+C)$.

That is to say, the height of the T-shaped boss is 50%-71% of the sum of the height of the boss and total thickness of the leads, and the optimum height of the boss is a golden ratio of the sum of the height of the boss and the total thickness of the leads.

Further, the height of the T-shaped boss also satisfies the following formula:

$$A=B+H,$$

$$B=H=A\times½,$$

$$E<D<2E,$$

Further, a good welding performance could be achieved when the diameter D of the boss welding platform is 100-300 times of the diameter of the metallic wire, or the ratio of the diameter D of the boss welding platform to the diameter of the metallic wire is between 100:1 and 300:1.

To sum up, the above is a description about the structure of boss 36 as shown is FIG. 4-4 to FIG. 4-6.

The following technical effects can be achieved with the special lead structure in conjunction with the boss 36, especially the T-shaped boss:

1. The T-shaped boss structure design, may serve as a soldering pad, in the meantime, lock the plastic package body and secure the leads in the plastic package body.

2. With the T-shaped boss structure design, it is only necessary to coat the upper surface of the boss with silver, which reduces coating material used and saves the cost.

3. With the T-shaped boss structure design, height difference between the integrated circuit and the leads is reduced, arc height of the bonding metallic wire has been reduced too, radian of the metallic wire at the first bond (located on the integrated circuit) is relieved, welding neck defects at the first bond of the metallic bonding wire due to a large radian is relieved too, which improves the bonding quality.

4. Comparing with the traditional Z-shaped suspension design mechanism, the T-shaped boss structure designed in the present invention is of a better stability and more stable bonding force, and furthermore, the T-shaped boss structure is more conducive to welding connection at the second bond between the bonding metallic wire and the leads (a welding point located on the boss welding side of the leads) and improves welding quality at the second bond.

5. The T-shaped boss structure design is based on thickness of the lead frame, thickness of the semiconductor chip and diameter of the bonding metallic wire, and in this way, an optimum package structural effect is achieved.

It should be noted that for some products with special requirements, the design of T-boss structure can be adjusted accordingly, which also belongs to the scope of the present invention.

Figure 51:
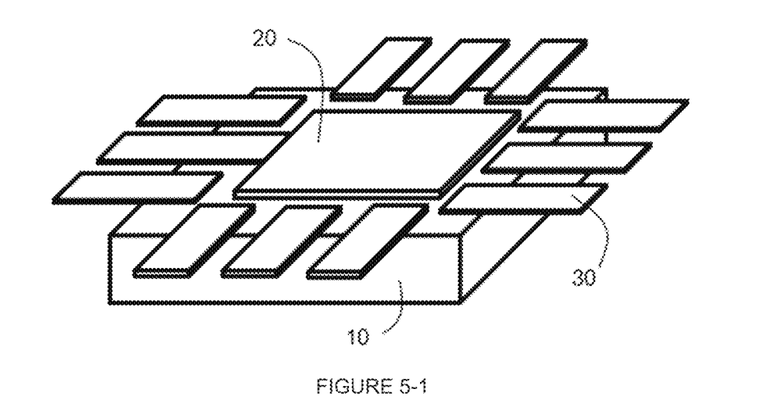
Figure 52:
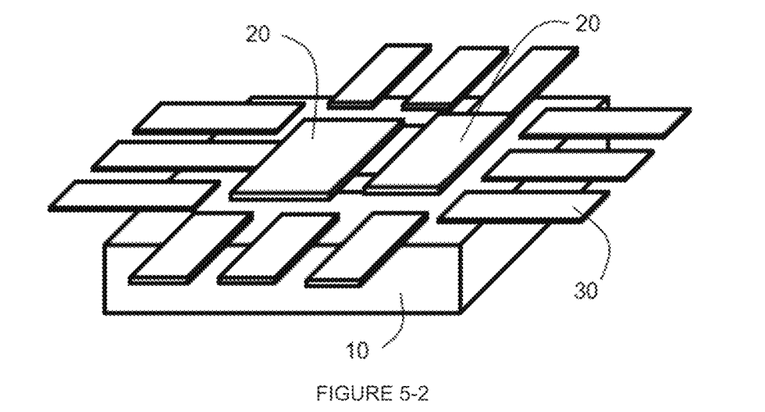
Figure 53:
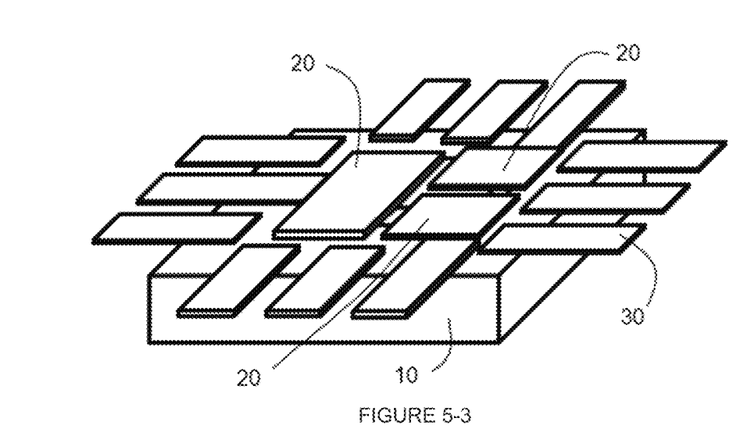

The encapsulation structure according to embodiments of the present invention can be designed to have different number and shape of die pads as per requirements of different products (degree of functional complexity), so as to meet the relevant requirements. That is to say, number and shape of the die pads are not be limited. As shown in FIG. 5-1, one die pad 20 is encapsulated in the package body 10; as shown in FIG. 5-2, two die pads 20 are encapsulated in the package body 10; as shown in FIG. 5-3, three die pads 20 are encapsulated in the package body 10; and more die pads could be encapsulated in the package body 10 as necessary.

Figure 71:
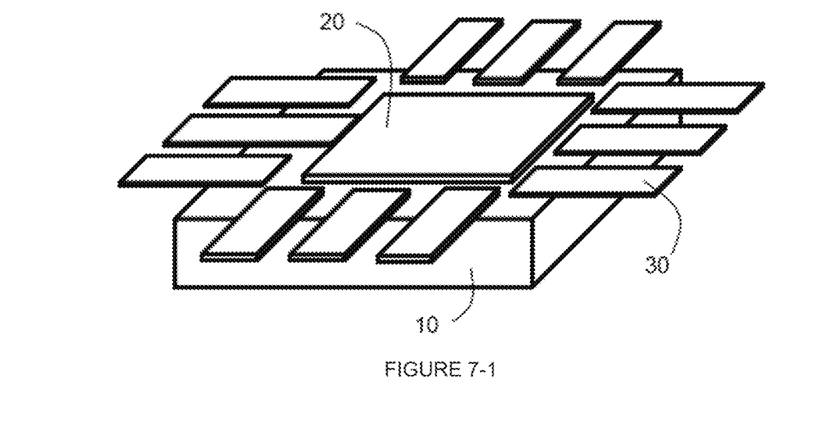
Figure 72:
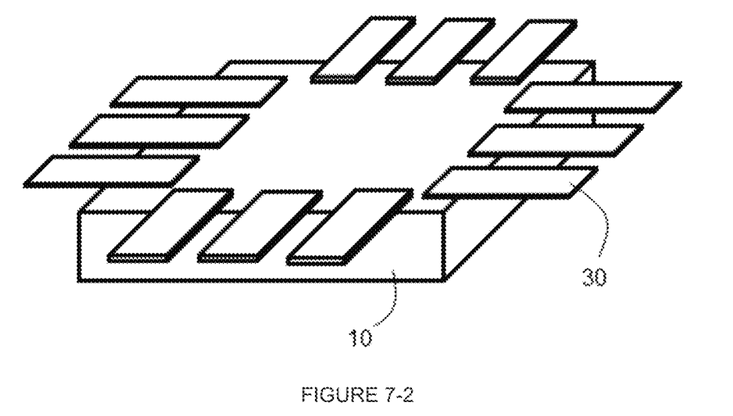

In the encapsulation structure according to embodiments of the present invention it is possible to determine whether the die pad 20 is exposed or not according to requirements of different products. As shown in FIG. 7-1, the die pad 20 is exposed in the bottom of package body 10. Alternatively, as shown in FIG. 7-2, the die pad 20 is unexposed and located inside the package body 10.

Figure 81:
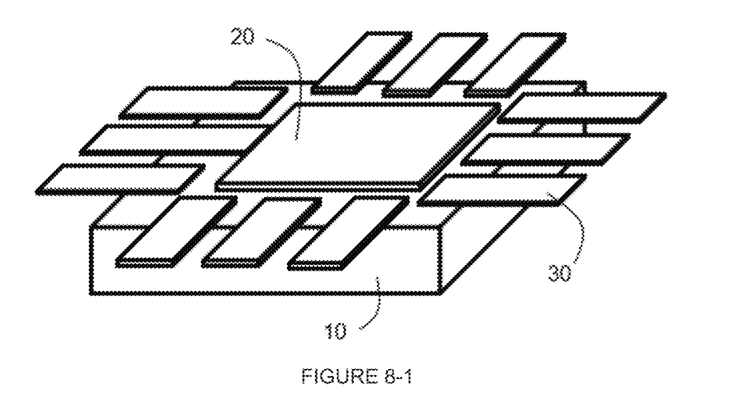
Figure 82:
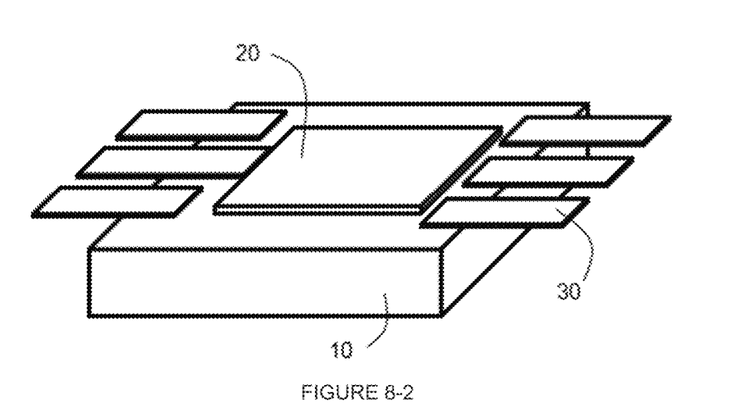
Figure 83:
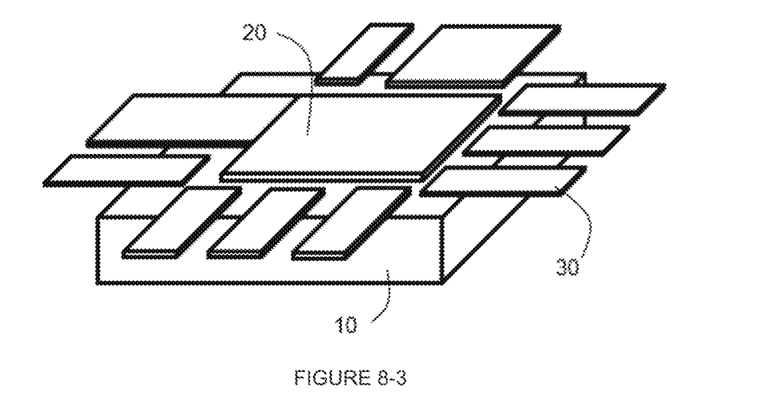
Figure 91:
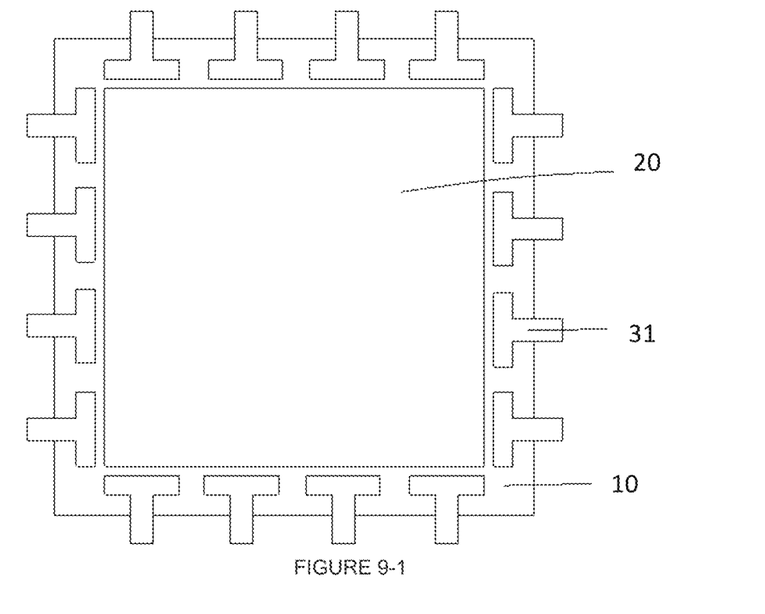
Figure 92:
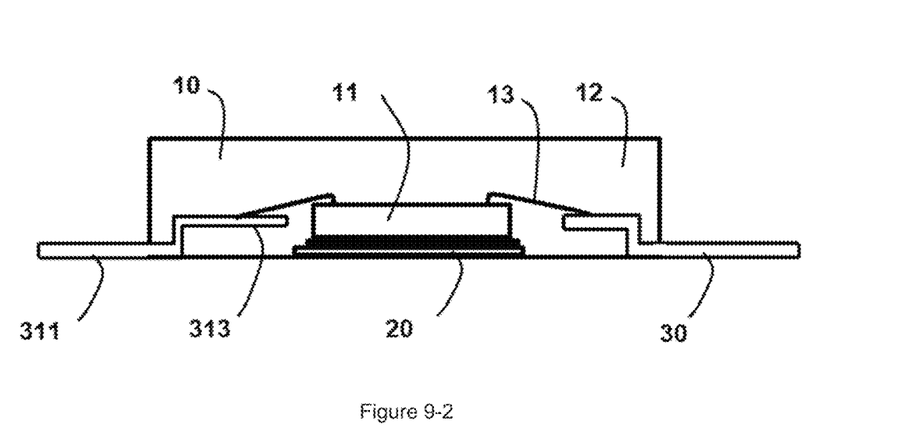

In the encapsulation structure according to embodiments of the present invention, it is possible to determine arrangement of the leads 30 according to requirements of different products. The leads 30 could be arranged on two sides or all four sides of the package body 10, and the leads 30 on two opposing sides could be symmetric or asymmetric. As shown in FIG. 8-1, the leads are arranged on four sides of the package body 10 and the leads on opposite sides are symmetric. As shown in FIG. 8-2, the leads 30 are arranged two sides of the package body 10 symmetrically. As shown in FIG. 8-3, the leads 30 are arranged on all four sides of the package body 10, and the leads 30 on opposite sides are asymmetric.

In the encapsulation structure according to embodiments of the present invention, the leads 30 could be of various shapes, such as a strip, T-shaped or other shapes. As shown in FIG. 8-1 to FIG. 8-3, the leads 30 are a shape of a straight and long strip. As shown in FIG. 9-1, the leads 30 is T-shaped, i.e. a turning portion 312 is vertically connected to a straight portion 311. As shown in FIG. 9-2, the leads are respectively provided with an upwardly convex lead at the inner ends, i.e. each of the leads 30 comprise a straight portion 311 and a upwardly convex portion 313 connected to the straight portion 311, and the leads of this form can be better connected with the package body 10 and the connection is firmer. Moreover, the leads 30 as shown in FIG. 8-1 to FIG. 8-3 and FIG. 9-1 are planar members, but the leads 30 shown in FIG. 9-2 are not.

The encapsulation structure depicted in the present invention has involved a number of technical improvements compared with prior arts.

Figure 6:
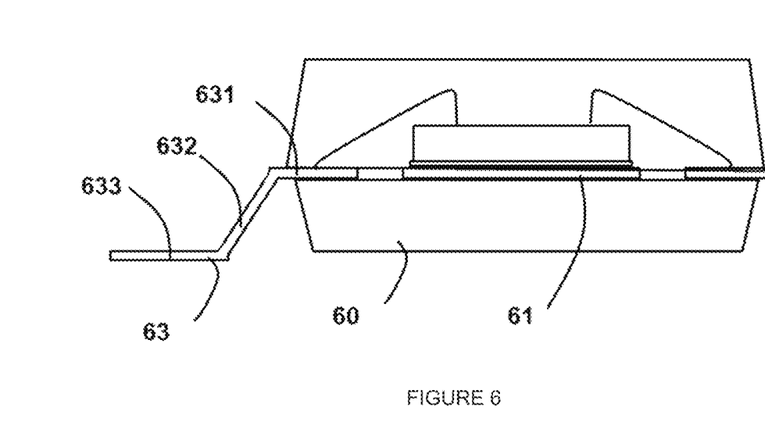
FIG. 6 is a schematic view of a traditional encapsulation structure.

Refer to the FIG. 6, where a traditional chip encapsulation structure is shown. As shown in the present figure, the die pad is arranged at the center of the plastic package body 60 and is completely encapsulated, the leads 63 are bent on a vertical plane to be Z-shaped, and each of the leads includes a first part 631, a second part 632 which is bent downward and connected to the first part 631, and a third part 633, which is connected with the second part 633 and extends horizontally.

Traditional encapsulation structure has defects such as large size, thick product, bulky volume, and limited secondary assembly space. Nevertheless, in the encapsulation structure of the present invention, as the die pad and the leads are arranged at the bottom of the package body, and could be planar members with minimal vertical dimensions, the whole product is made very thin, the thickness thereof is reduced by about ½, and the volume of the whole product is reduced to about 40%, which is suitable for smaller space assembly and can satisfy highly integrated and tiny size secondary assembly demands, such as assembly of encapsulation modules of higher end and system level.

In the traditional encapsulation structure, the die pad is arranged inside the package body, not exposed and heat dissipation effect is not satisfactory so that it cannot be applied to products of high heat dissipation demand and is limited in scope of application. Nevertheless, by providing an exposed die pad, the encapsulation structure according to the present invention has better heat dissipation property and could be applied to products of high heat dissipation requirement and consequently has wider scope of application (like LED power module, 5G communication power module, motor drive module, etc.). Of course, it is also possible to flexibly choose whether the die pad is exposed or not in the present invention.

In the traditional encapsulation structure, leads are arranged on two opposing sides of a product and due to limited space in only two sides, a less number of leads can be employed. Nevertheless, in the encapsulation structure according to the present invention, the leads are arranged on a plurality of sides of the product, for example, four sides, thereby making full use of the space of four sides. With the same product volume, the present invention greatly increases the number of leads, which is twice of the traditional encapsulation structure, thereby satisfying the requirements of more complex product with multi-output ports, realizing the high integration, complexity, miniaturization, and enhanced applicability of the product.

In the traditional encapsulation structure, the leads need to be bent and folded into a Z-shape. When it is subject to external mechanical force, the leads are prone to deformation and the plastic package body is prone to be damaged. Nevertheless, in the encapsulation structure of the present invention, instead of being a Z shape, the leads directly protrude out as welding leads for assembly of subsidiary modules, so as to reduce the stress when the leads are bent, avoid damage to the plastic package body and improve the product quality.

In the traditional encapsulation structure, the Z-shaped leads are unstable in the metallic wire welding process, the lead welding position is suspended, and the welding force is unstable during welding, thereby making a poor welding, affecting the product yield, causing instability in production, and reducing the production output. Nevertheless, in the encapsulation structure of the present invention, instead of a zigzagged shape, and the lead is of a structure extending on a plane. In the metallic wire welding process, the leads are closely supported, and the welding force is stable during welding, so that the welding is good and the production is stable and the quality is reliable.

In the traditional encapsulation structure, the Z-shaped leads consume more copper for lead frames. Nevertheless, it is not necessary to bend or zigzag the leads in the encapsulation structure of the present invention, thereby saving a part of the copper material in the traditionally bent leads, and improving utilization rate of the copper material of the lead frames by about 10%.

In the traditional encapsulation structure, it is necessary to punch form the die pad and leads twice during the lead frame machining. The co-planarity of the die pad and the leads is greatly affected and the processing difficulty is increased. Meanwhile, the co-planarity will affect the yield and stability of product package. Nevertheless, it is not necessary to punch form the die pad and the leads in the encapsulation structure of the present invention twice during the lead frame processing, and the co-planarity of the die pad and the leads will be maintained very well. The punching and etching processes can also be freely selected to process the lead frame and the processing complexity and difficulty are reduced in the present invention.

In the traditional encapsulation structure, arrangement density of the product in the entire lead frame is not high; at the same time, as the leads in the product are long, additional cross ribs are required to support them, thereby occupying the space of lead frame and reducing the arrangement density of the product in the lead frame. Nevertheless, in the present invention, length of the leads is shortened and the arrangement density in the entire lead frame is increased by about 10%, which improves the output capacity of production processes based on the lead frame (such as plastic packaging, trimming, electroplating, etc.)

The traditional encapsulation structure is thick and bulky so that a lot of plastic package materials are consumed to form a plastic package body.

Nevertheless, in the present invention, the use of plastic package materials to form a plastic package body is greatly reduced, and the quantity of the plastic encapsulation materials used in the present invention is about 50% of that of the traditional one, and the cost of the plastic encapsulation materials is reduced.

In the traditional encapsulation structure, there are fewer output leads, the die pad is large in volume but low in utilization rate, thus it can only be applied to lower-end products like encapsulated products with a single chip and a single die pad. Nevertheless, the encapsulation structure of the present invention is provided with many output leads, dual die pads or a plurality of die pads. It can be used in multi-chip encapsulation product and meet the requirements of high-end or highly integrated products like the encapsulation of CPU chip.

Compared with the traditional encapsulation structure, the encapsulation structure of the present invention also has greatly optimized the realization conditions including equipment, process, material or other conditions.

In the traditional encapsulation structure, there has to be a die pad for supporting the semiconductor die in the lead frame, long leads are designed, and it is necessary to stamp the die pad and the leads for a second time to have them protruding upwards, to be ready for chip mounting and welding procedures in the package process. Nevertheless, a special design of the lead frame is used in the package structure according to the present invention, which simplifies the design, shortens the leads, arranges the leads densely along all four sides, and it is not necessary to stamp the die pad and the leads convex for a second time.

In the traditional encapsulation structure, an upper mold and a lower mold are used to plastic package the product, without exposing the die pad and the leads of the product. And in the encapsulation structure according to the present invention, only half a mold is used, that is, bottom surfaces of the die pad and the leads are exposed in the plastic package body; and it is only necessary to protect the chip, the lead frame and the metallic wire with an upper mold, the die pad and the leads are on the same plane, with one side packaged by the plastic package materials and another sides exposed, without using a lower mold.

For traditional plastic encapsulation modes like QFN, DFN, etc., coating the back of the lead frame (front film or back film) is an indispensable process to ensure that the plastic encapsulation materials will not reflow to the rear side of the lead frame during molding. Nevertheless, in the packaging structure of the present invention, it is possible to design a corresponding mold, and with reflow preventing bosses between neighboring leads, and by compressing the leads of the lead frame with the upper mold, it is possible to plastic package the product without coating the rear side of the lead frame, and in the meantime, no adhesives will reflow to the rear side of the lead frame, and consequently, compared with traditional encapsulation processes such as QFN and DFN, the present invention has simplified the package process, avoided the lead frame rear side film attaching process, addressed product quality problems due to the lead frame rear side coating process, such as not proper welding, plastic package material over spilling, and saved material, manpower and equipment cost, and shortened overall processing time of the product.

In the traditional encapsulation structure, a bending step to bend the leads to a Z shape is necessary in the trimming and forming process. In the encapsulation structure according to the present invention, it is possible to separate the lead frame by cutting the leads, and it is not necessary to twist the leads outside the plastic package body to be Z-shaped, which reduces a step in the process.

The traditional encapsulation structure has to be encapsulated by fully packaging with plastic package materials. In the encapsulation structure of the present invention, the die pad and the leads of the lead frame can adopt a T-shaped or an inverted T-shaped structure to increase the locking and bonding force between the die pad and the leads, and high reliability is achieved by the half plastic package and half exposed design of the die pad and the leads.

As mentioned above, package of the special encapsulation structure according to the present invention can be realized by combining special designs of the lead frame, the plastic package mold, the plastic package locking design and trimming process.

The encapsulation structure of the present invention has wide applicability. SOT, SOP, LQFP and other encapsulation products whose leads are bent into Z-shape can convert to use the encapsulation structure of the present invention. Preferably, the encapsulation structure of the present invention is applicable to the following parameters: size range of the plastic package body: 0.6×0.8 mm-8×8 mm; number of leads: 1-64 (single side); single die pad or a plurality of die pads, exposed or unexposed die pad(s), die pads of varied shape; dual-sided or quad-sided leads extending outwards, leads of different shapes including stripe, T-shape, internally convex shape and so on the lead frame including but not limited to the copper one and other metallic ones, and thickness of the leads and the die pad in the present structure: 0.1 mm-0.5 mm.

In the encapsulation structure of the present invention, the packaging internal resistance can be reduced by 10%~50%, the encapsulation thermal resistance can be reduced by 20%~60%, and the frequency characteristic can be improved.

Comparing with the QFN and DFN packaging process, the metallic parts such as the die pad and the leads in the encapsulation structure of the present invention could be processed mechanically rather than by etching, so that the chemical process can be avoided and the electroplating processes can be saved, thereby effectively reducing environmental impact.

In the encapsulation structure of the present invention, the product separation can be changed from grinding in a deionized water environment to mechanical processing, thereby avoiding the production of deionized water.

In the encapsulation structure of the present invention, by providing the die pad and the leads in the bottom surface of the package body, difficulty of the chip mounting and bonding process is reduced, and as the bottom surface of the package body is made by punching, which is highly automatically fabricated with lower difficulty, reliability risk such as delamination has been reduced, making it appropriate for automatic injection molding and automatic testing and taping, and production efficiency is effectively increased.

Figure 10:
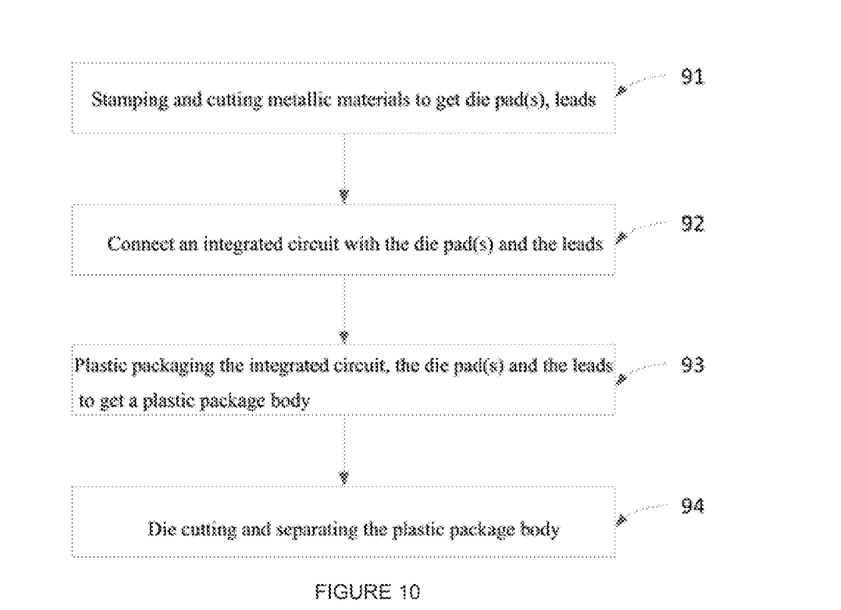
FIG. 10 is a flowchart of a manufacturing method for an encapsulation structure provided by an embodiment of the present invention.

With reference to the FIG. 10, a method for manufacturing the encapsulation structure with high density, multiple sided and exposed leads according to some embodiments of present invention is proposed, comprising following steps:

91. punching the metal lead frame to form a die pad and a plurality of leads, the leads comprises a first lead isolated from the die pad, and both the die pad and the leads are planar members.

92. connecting the integrated circuit with the die pad and the leads;

93. plastic packaging the integrated circuit, the die pad and the leads to get a plastic package body, wherein, the die pad and the leads are provided in a bottom of the package body, bottom surfaces of the leads exposed in a bottom surface of the package body, and the leads extends towards multiple sides of the package body until beyond the package; a bottom surface of the die pad and the bottom surfaces of the leads are provided on the same horizontal plane; and 94. punching and separating the plastic package body.

Further, in step 92, the integrated circuit can be fixed to the die pad by die attaching or reflow welding process and can be connected to the leads by metallic wire.

Further, in the plastic package step in step 93, corresponding mold can be used to assist the plastic encapsulation, comprising compacting leads in the lead frame with an upper mold, providing reflow preventing bosses between neighboring leads, and packaging with plastic, among which, no film has been attached to the rear side of the lead frame. And by this process, adhesive overflow to the rear side of the lead frame has been successfully addressed.

In the above embodiments, description of each embodiment has different emphasis. For the part not described in details in one embodiment, please refer to the relevant descriptions of other embodiments.

The above embodiments are only used to describe the technical scheme of the invention and not to restrict it; ordinary technicians in this field should understand that they may still modify the technical scheme recorded in the above embodiments or replace some of their technical features equally; However, such modifications or substitutions do not make the essence of the corresponding technical scheme depart from the spirit and scope of the technical scheme of each embodiment of the invention.

We claim:

1. An encapsulation structure with high density, multiple sided and exposed leads comprising:

a package body, a die pad and a plurality of leads, wherein the die pad and the plurality of leads are disposed at a bottom of the package body; bottom surfaces of the plurality of leads expose in a bottom surface of the package body, and the plurality of leads extends towards multiple sides of the package body until beyond the package body;

the package body includes an integrated circuit provided on the die pad and connected with the plurality of leads, and a plastic package body for packaging the integrated circuit, the die pad and the plurality of leads;

a bottom surface of the die pad and the bottom surfaces of the plurality of leads are provided on the same horizontal plane;

the plurality of leads comprise a first lead distant from the die pad;

wherein the first lead comprises a straight portion extending along a horizontal plane, and one end of the straight portion extends beyond the package body;

wherein the first lead also comprises a turning portion extending on a horizontal plane, the turning portion is connected to another end of the straight portion located within the package body, and the turning portion is located in the package body, the turning portion comprises an inclined section and a parallel section, and the parallel section is parallel to and connected with the straight portion by the inclined section;

the turning portion and the straight portion satisfy the following relation:

$$L1 = L2 \times \cos\theta + L3, \quad L3 = L2,$$

wherein length of the straight portion within the package body is a half of length of the straight portion beyond the package body;

wherein L1 is length of the straight portion, L2 is length of the inclined section, L3 is length of the parallel section and θ is an angle between the inclined section and the straight portion;

wherein a T-shaped boss is provided on an upper surface of one end portion of the first lead located in the package body, and the T-shaped boss comprises a boss supporting platform connected to an upper surface of the first lead and a boss welding platform on top of the boss supporting platform, and width of the boss welding platform is greater than width of boss supporting platform;

a lower end portion of the boss supporting platform is located on the upper surface of the first lead;

wherein width of the T-shaped boss A and width of the boss supporting platform C satisfy following relation:

$$A=(A+C)*(\sqrt{\sqrt{5}}-1)/2$$

wherein, height of the boss supporting platform is B, height of the boss welding platform is H, diameter of the boss supporting platform is E, diameter of the boss welding platform is D, and following formula is satisfied:

$$A=B+H,$$

$$B=H=A\times\frac{1}{2},$$

$$E<D<2E;$$

a ratio of diameter D of the boss welding platform to diameter of metal wires is between 100:1 and 300:1.

2. The encapsulation structure according to claim 1, wherein the die pad is exposed in the bottom surface of the package body, and the bottom surface of the die pad and the bottom surface of the plastic package are in the same horizontal plane.

3. A method for manufacturing the encapsulation structure with high density, multiple sided and exposed leads according to claim 2, comprising following steps of:
punching a metal lead frame to be (a) die pad(s) and a plurality of leads, the plurality of leads comprises a first lead distant from the die pad(s);
connecting an integrated circuit with the die pad(s) and the plurality of leads;
packaging the integrated circuit, the die pad(s) and the plurality of leads with plastic to be an plastic package body, wherein, the die pad(s) and the plurality of leads are provided in a bottom of the package body, bottom surfaces of the plurality of leads are exposed in a bottom surface of the package body, and the plurality of leads extends towards multiple sides of the package body until beyond the package body; a bottom surface of the die pad(s) and the bottom surfaces of the plurality of leads are provided on the same horizontal plane; and
punching and separating the plastic package body.

4. The encapsulation structure according to claim 1, wherein the package body has four sides, and the plurality of leads extend along two opposite sides or four side surfaces of the package body and extend beyond the package body.

5. A method for manufacturing the encapsulation structure with high density, multiple sided and exposed leads according to claim 4, comprising following steps of:
punching a metal lead frame to be (a) die pad(s) and a plurality of leads, the plurality of leads comprises a first lead distant from the die pad(s);
connecting an integrated circuit with the die pad(s) and the plurality of leads;
packaging the integrated circuit, the die pad(s) and the plurality of leads with plastic to be an plastic package body, wherein, the die pad(s) and the plurality of leads are provided in a bottom of the package body, bottom surfaces of the plurality of leads are exposed in a bottom surface of the package body, and the plurality of leads extends towards multiple sides of the package body until beyond the package body; a bottom surface of the die pad(s) and the bottom surfaces of the plurality of leads are provided on the same horizontal plane; and
punching and separating the plastic package body.

6. The encapsulation structure according to claim 1, wherein an end portion of the first lead located inside the package body is provided with a first end surface facing the package body, the package body is provided with a second end surface facing the first end surface, the first end surface is provided with a first indentation, and/or the second end surface is provided a second indentation.

7. A method for manufacturing the encapsulation structure with high density, multiple sided and exposed leads according to claim 6, comprising following steps of:
punching a metal lead frame to be (a) die pad(s) and a plurality of leads, the plurality of leads comprises a first lead distant from the die pad(s);
connecting an integrated circuit with the die pad(s) and the plurality of leads;
packaging the integrated circuit, the die pad(s) and the plurality of leads with plastic to be an plastic package body, wherein, the die pad(s) and the plurality of leads are provided in a bottom of the package body, bottom surfaces of the plurality of leads are exposed in a bottom surface of the package body, and the plurality of leads extends towards multiple sides of the package body until beyond the package body; a bottom surface of the die pad(s) and the bottom surfaces of the plurality of leads are provided on the same horizontal plane; and
punching and separating the plastic package body.

8. The encapsulation structure according to claim 1, wherein an upper surface of one end portion of the first lead located in the package body is provided with a third indentation, and/or an upper surface of the die pad on a side close to the first lead is provided with a fourth indentation.

9. A method for manufacturing the encapsulation structure with high density, multiple sided and exposed leads according to claim 8, comprising following steps of:
punching a metal lead frame to be (a) die pad(s) and a plurality of leads, the plurality of leads comprises a first lead distant from the die pad(s);
connecting an integrated circuit with the die pad(s) and the plurality of leads;
packaging the integrated circuit, the die pad(s) and the plurality of leads with plastic to be an plastic package body, wherein, the die pad(s) and the plurality of leads are provided in a bottom of the package body, bottom surfaces of the plurality of leads are exposed in a bottom surface of the package body, and the plurality of leads extends towards multiple sides of the package body until beyond the package body; a bottom surface of the die pad(s) and the bottom surfaces of the plurality of leads are provided on the same horizontal plane; and
punching and separating the plastic package body.

10. A method for manufacturing the encapsulation structure with high density, multiple sided and exposed leads according to claim 1, comprising following steps of:
punching a metal lead frame to be (a) die pad(s) and a plurality of leads, the plurality leads comprises a first lead distant from the die pad(s);
connecting an integrated circuit with the die pad(s) and the plurality of leads;
packaging the integrated circuit, the die pad(s) and the plurality of leads with plastic to be an plastic package body, wherein, the die pad(s) and the plurality of leads are provided in a bottom of the package body, bottom surfaces of the plurality of leads are exposed in a bottom surface of the package body, and the plurality of leads extends towards multiple sides of the package body until beyond the package body; a bottom surface of the die pad(s) and the bottom surfaces of the plurality of leads are provided on the same horizontal plane; and punching and separating the plastic package body.

* * * * *